(12) United States Patent
Yudovsky et al.

(10) Patent No.: US 11,798,825 B2
(45) Date of Patent: Oct. 24, 2023

(54) IN-SITU WAFER ROTATION FOR CAROUSEL PROCESSING CHAMBERS

(71) Applicant: Applied Materials, Inc., Santa Clara, CA (US)

(72) Inventors: Joseph Yudovsky, Campbell, CA (US); Alexander S. Polyak, Palm Coast, FL (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 352 days.

(21) Appl. No.: 16/396,683

(22) Filed: Apr. 27, 2019

(65) Prior Publication Data
US 2019/0333783 A1 Oct. 31, 2019

Related U.S. Application Data

(60) Provisional application No. 62/664,155, filed on Apr. 28, 2018.

(51) Int. Cl.
H01L 21/67 (2006.01)
H01L 21/68 (2006.01)
(Continued)

(52) U.S. Cl.
CPC ...... H01L 21/6719 (2013.01); C23C 16/4584 (2013.01); C23C 16/45544 (2013.01); H01L 21/67196 (2013.01); H01L 21/68 (2013.01); H01L 21/68764 (2013.01); H01L 21/68792 (2013.01); H01L 2221/68309 (2013.01)

(58) Field of Classification Search
CPC ......... H01L 21/68764; H01L 21/68785; H01L 21/68792
See application file for complete search history.

(56) References Cited

U.S. PATENT DOCUMENTS 4,284,033 A * 8/1981 del Rio ................. C23C 14/505
118/730
6,761,722 B2 * 7/2004 Cole ................... A61B 17/0401
606/74
(Continued)

FOREIGN PATENT DOCUMENTS

JP 07-026378 A 1/1995
JP H0734928 Y2 8/1995
(Continued)

OTHER PUBLICATIONS

PCT International Search Report and Written Opinion in PCT/US2019/029291 dated Aug. 23, 2019, 12 pages.

Primary Examiner — Parviz Hassanzadeh
Assistant Examiner — Nathan K Ford
(74) Attorney, Agent, or Firm — Servilla Whitney LLC

(57) ABSTRACT

Apparatus and methods of processing a substrate in a carousel processing chamber are described. A wafer pedestal has a support surface with a support shaft extending below the wafer pedestal. A roller pinion wheel is below the wafer support around the support shaft. The roller pinion wheel has a plurality of spokes in contact with the support shaft and a wheel with a plurality of roller pinions spaced around the outer periphery of the wheel. Processing chambers incorporating the wafer pedestal and processing methods using the wafer pedestal for in-situ rotation are also described.

13 Claims, 8 Drawing Sheets

(51) Int. Cl.
  *H01L 21/687* (2006.01)
  *C23C 16/458* (2006.01)
  *C23C 16/455* (2006.01)

(56) References Cited

U.S. PATENT DOCUMENTS

| | | | |
|---|---|---|---|
| 6,761,772 B2* | 7/2004 | Giacri | C23C 14/505 |
| | | | 118/730 |
| 6,966,952 B2 | 11/2005 | Kim et al. | |
| 8,534,976 B2 | 9/2013 | Gertmann et al. | |
| 9,074,280 B2 | 7/2015 | Pei | |
| 2003/0015136 A1 | 1/2003 | Giacri et al. | |
| 2003/0047199 A1 | 3/2003 | Worm | |
| 2005/0150461 A1 | 7/2005 | Kim et al. | |
| 2009/0056630 A1 | 3/2009 | Hester et al. | |
| 2011/0159702 A1 | 6/2011 | Ohizumi et al. | |
| 2012/0099949 A1 | 4/2012 | Gertmann et al. | |
| 2012/0228124 A1 | 9/2012 | Veprek et al. | |
| 2013/0160710 A1 | 6/2013 | Pei | |
| 2014/0261161 A1 | 9/2014 | Miura et al. | |
| 2014/0262769 A1 | 9/2014 | Miura et al. | |
| 2017/0051390 A1* | 2/2017 | Miao | C23C 14/046 |
| 2017/0218514 A1* | 8/2017 | Kato | H01J 37/3244 |
| 2018/0037990 A1* | 2/2018 | Kato | H01L 21/0228 |
| 2018/0251892 A1* | 9/2018 | Kobayashi | C23C 16/4584 |

FOREIGN PATENT DOCUMENTS

| | | |
|---|---|---|
| JP | 2016135899 A | 7/2016 |
| TW | 201812077 A | 4/2018 |
| WO | 2018166635 A1 | 9/2018 |

* cited by examiner

IN-SITU WAFER ROTATION FOR CAROUSEL PROCESSING CHAMBERS

CROSS-REFERENCE TO RELATED APPLICATIONS

This application claims priority to U.S. Provisional Application No. 62/664,155, filed Apr. 28, 2018, the entire disclosure of which is hereby incorporated by reference herein.

TECHNICAL FIELD

The present disclosure relates generally to apparatus and methods to deposit thin films. In particular, the disclosure relates to apparatus and methods to deposit thin films using processing tools with carousel wafer supports.

BACKGROUND

Process uniformity in mainframe processing chambers can be poor due to a variety of factors. Rotating wafers throughout the process can help improve the within wafer uniformity. The amount of rotation, small and/or a few rotations can improve the uniformity. Rotating a wafer during processing can be time consuming and uses additional process hardware or space. For example, the wafers can be moved to a dedicated region of a processing tool where the wafer can be rotated. This is inefficient from a throughput perspective and uses additional floor space for a batch processing tool or cluster tool.

Therefore, there is a need in the art for methods and apparatus to rotate wafers during processing in mainframe process chambers to increase within wafer uniformity.

SUMMARY

One or more embodiments of the disclosure are directed to wafer pedestals comprising: a wafer support having a support surface and a bottom surface defining a wafer support thickness; a wafer support shaft connected to the wafer support and extending from the bottom surface; and a roller pinion wheel below the wafer support, the roller pinion wheel having a plurality of spokes extending from and in contact with the wafer support shaft to a wheel, the wheel having a plurality of roller pinions spaced around an outer periphery of the wheel.

Additional embodiments of the disclosure are directed to processing chambers comprising: a chamber body having a top, a bottom and sidewall defining a processing volume; a susceptor assembly within the processing volume, the susceptor assembly having a top surface with a plurality of recesses, each recess having a wafer pedestal positioned therein so that when the wafer pedestal is in a process position, the support surface is a distance below the top surface of the susceptor assembly; and a rotation pin within the processing volume positioned to contact a roller pinion on a roller pinion wheel to rotate the wafer support pedestal.

Further embodiments of the disclosure are directed to processing methods comprising: rotating a plurality of wafer on a susceptor assembly around a central axis; each wafer supported on a wafer pedestal; contacting a roller pinion on the roller pinion wheel with a rotation pin to rotate the wafer support pedestal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
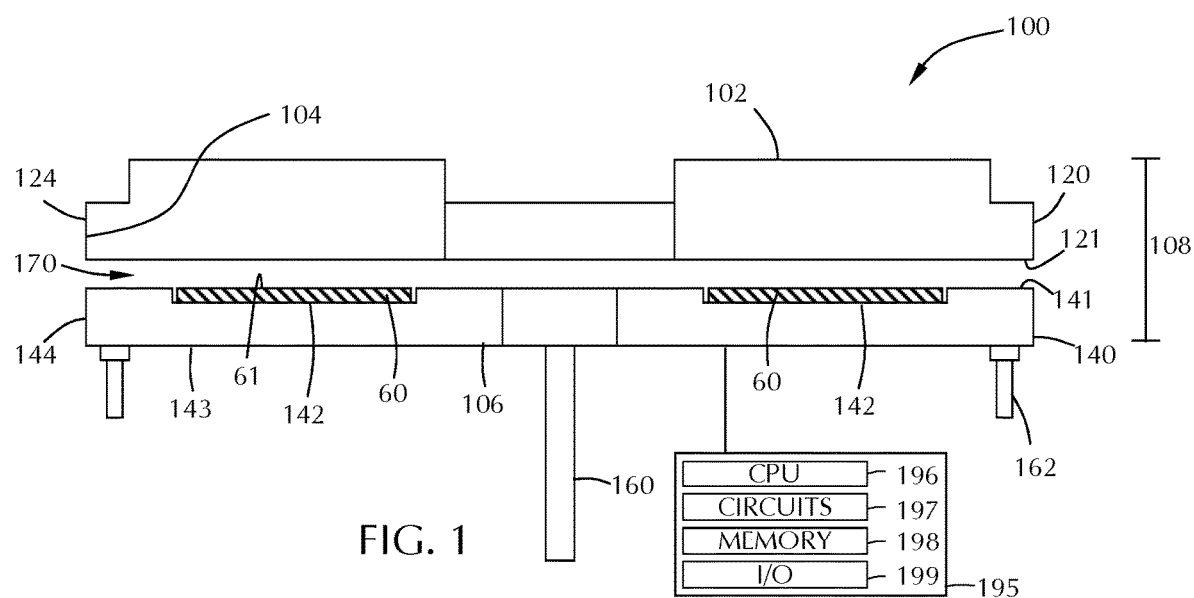
FIG. 1 shows a cross-sectional view of a batch processing chamber in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

Some embodiments of the disclosure provide on-the-fly in-situ wafer rotation systems and methods to improve process uniformity. In some embodiments, a discrete wafer rotation can be effected without stopping rotation of the susceptor, and potentially, during deposition. Some embodiments advantageously provide systems with a roller pinion wheel attached to a wafer pedestal that interacts with an actuator pin while the susceptor rotates. When the actuator pin is in the way of the pinions rollers, the wafer pedestal rotates relative to the susceptor. The actuator pin could be moved from the pinion to stop relative wafer rotation. A wafer rotation angle is controlled by an actuator pin engaged with the pinon. Some embodiments advantageously provide apparatus and methods to effect sequential wafer rotation.

Some embodiments of the disclosure are directed to film deposition processes using a batch processing chamber, also referred to as a spatial processing chamber. FIG. 1 shows a cross-section of a processing chamber 100 having a chamber top 102, a chamber sidewall 104, and a chamber bottom 106 which together form a chamber body 108 defining a processing volume.

The processing chamber 100 includes a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which, in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s).

Figure 2:
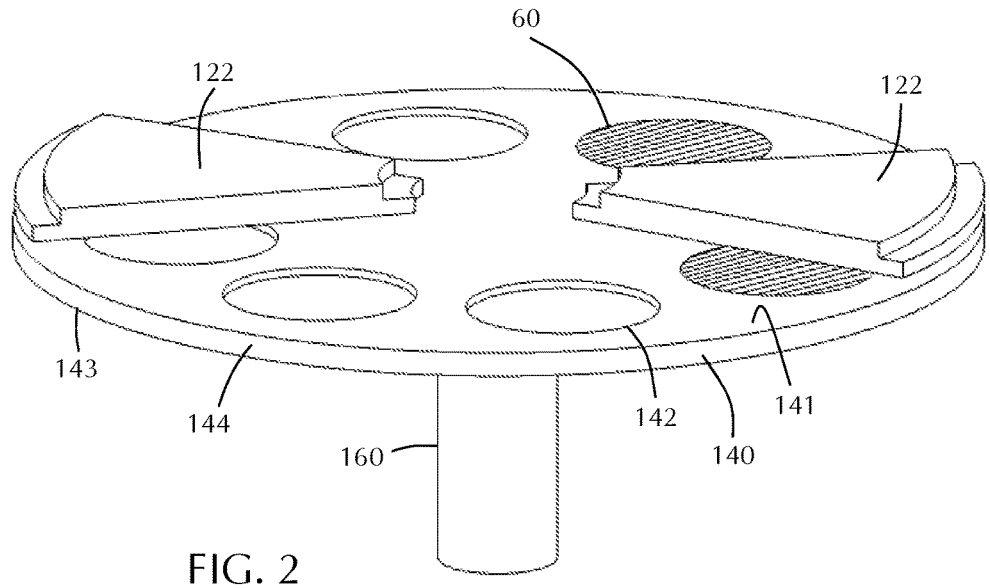
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120 within the chamber body 108 of the processing chamber 100. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess 142 has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering, and rotating the susceptor assembly 140 around an axis. The susceptor assembly may include a heater, or gas lines, or electrical components within the center of the support post 160. The support post 160 may be the primary means of increasing or decreasing the gap 170 between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
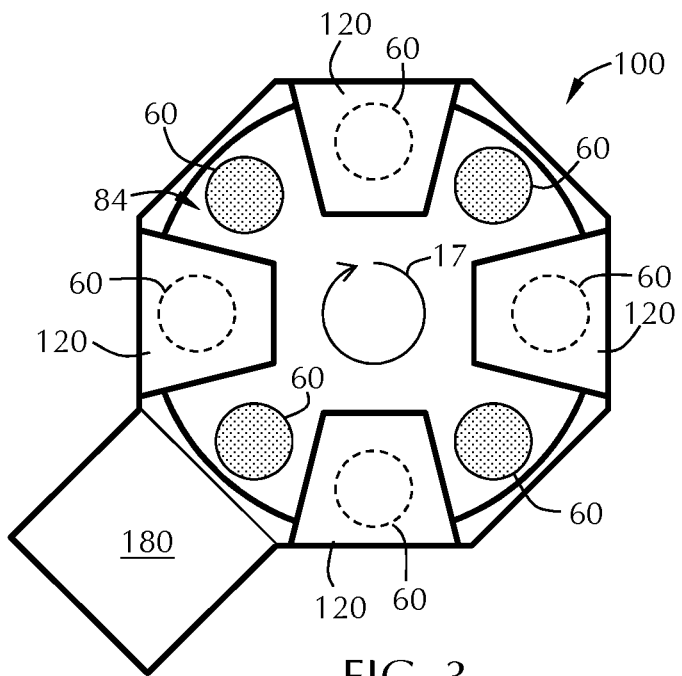
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas distribution assemblies 120 and four substrates 60. At the outset of processing, the substrates 60 can be positioned between the gas distribution assemblies 120. Rotating 17 the susceptor assembly 140 by 45° will result in each substrate 60 which is between gas distribution assemblies 120 to be moved to another gas distribution assembly 120 for film deposition, as illustrated by the dotted circle under the gas distribution assemblies 120. An additional 45° rotation would move the substrates 60 away from the gas distribution assemblies 120. The number of substrates 60 and gas distribution assemblies 120 can be the same or different. In some embodiments, there are the same numbers of wafers being processed as there are gas distribution assemblies. In one or more embodiments, the number of wafers being processed are a fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight processing regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies 120 (also called injector assemblies) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example, the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing between each layer deposition (e.g., exposure to plasma).

Figure 4:
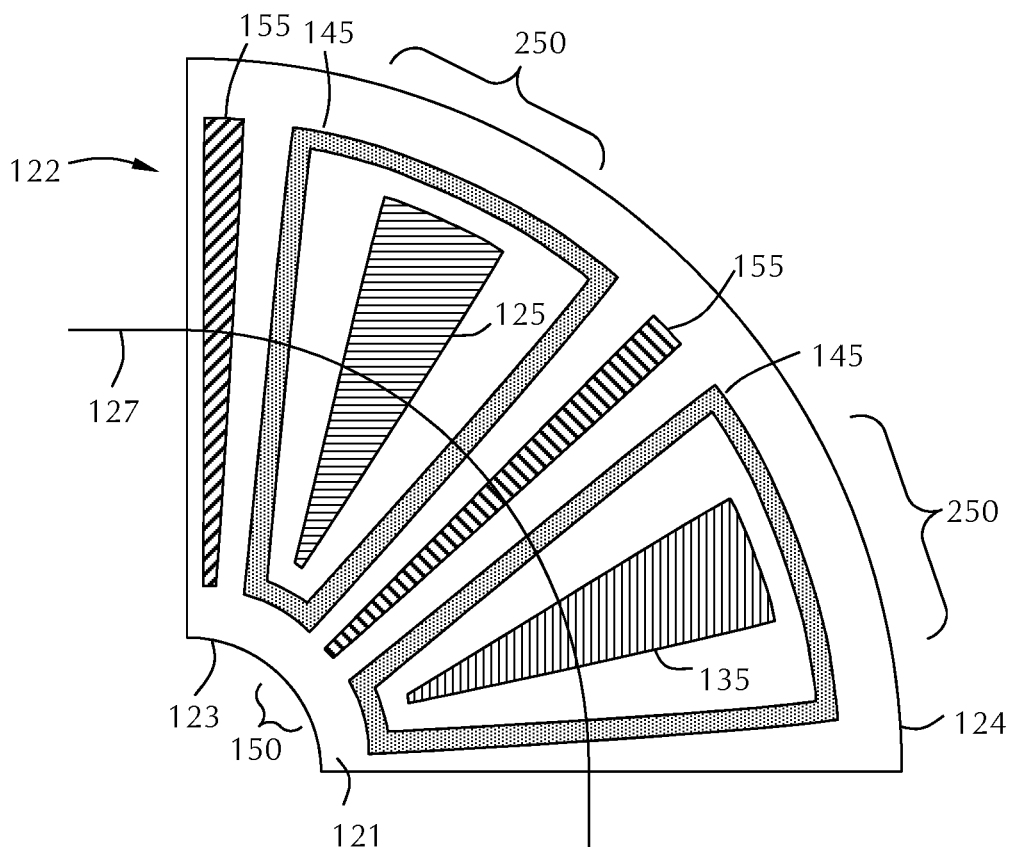
FIG. 4 shows a schematic view of a portion of a wedge shaped gas distribution assembly for use in a batch processing chamber in accordance with one or more embodiment of the disclosure.
Figure 5:
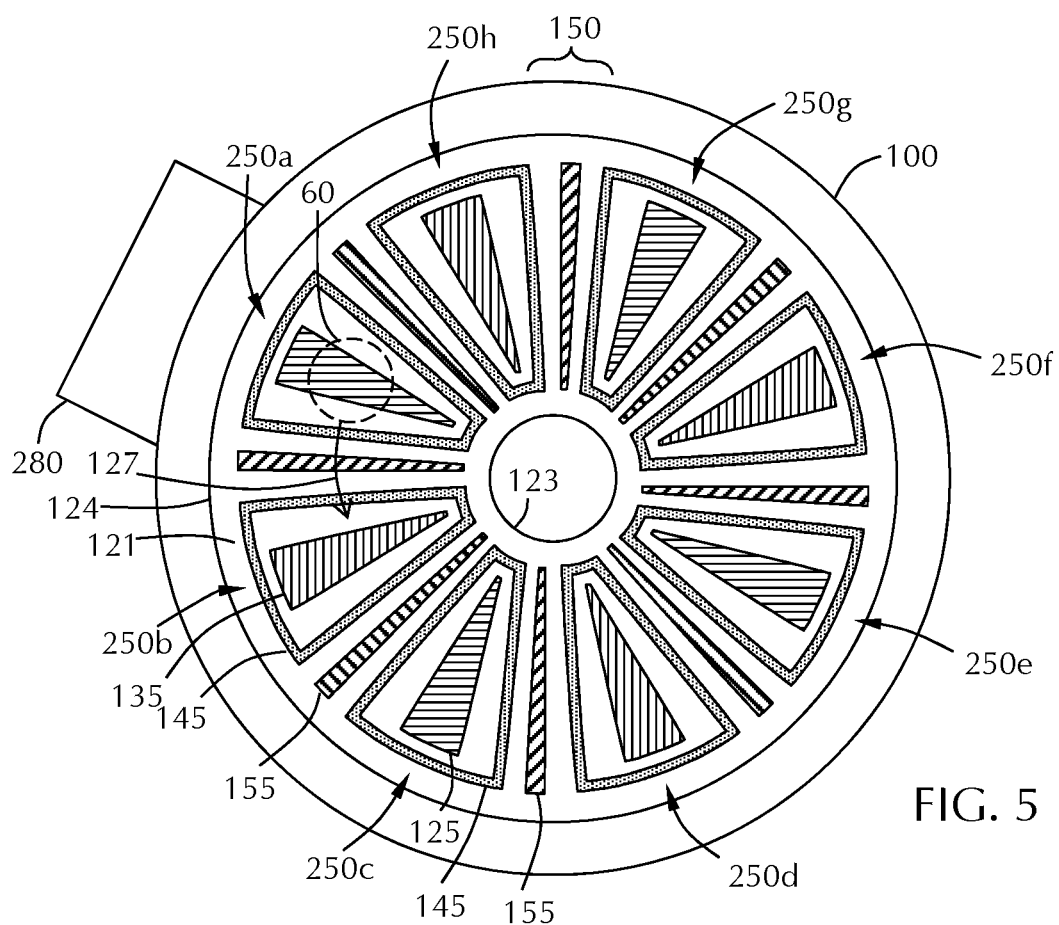
FIG. 5 shows a schematic view of a batch processing chamber in accordance with one or more embodiments of the disclosure.

FIG. 4 shows a sector or portion of a gas distribution assembly, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongated gas ports 125, 135, 155 and elongated vacuum ports 145 in a front surface 121 of the gas distribution assembly 220. The plurality of elongated gas ports 125, 135, 155 and elongated vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first gas port 125 and the second gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, ten, eleven or twelve processing regions.

During processing a substrate may be exposed to more than one processing region 250 at any given time. However, the portions that are exposed to the different processing regions will have a gas curtain separating the two. For example, if the leading edge of a substrate enters a processing region including the second gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first processing region 250a through the eighth processing region 250h, including all processing regions between.

Embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions. In some embodiments, the number of processing regions is greater than the number of gas curtains and one or more of the gases present in the processing regions not separated by a gas curtain are combined.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example, if the first reactive gas is flowing into processing regions 250b through processing region 250h, an inert gas would be flowing into processing region 250a. The inert gas can be flowed through the first reactive gas port 125 or the second gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Accordingly, one or more embodiments of the disclosure are directed to processing methods utilizing a batch processing chamber like that shown in FIG. 5. A substrate 60 is placed into the processing chamber which has a plurality of sections 250, each section separated from adjacent section by a gas curtain 150. At least a portion of the substrate surface is exposed to a first process condition in a first section 250a of the processing chamber.

The substrate surface is laterally moved through a gas curtain 150 to a second section 250b of the processing chamber. The substrate surface is exposed to a second process condition in the second section 250b.

The substrate surface is laterally moved through a gas curtain 150 to a third section 250c of the processing chamber. The substrate surface can then be exposed to a third process condition in the third section 250c. In some embodiments, the third section 250c contains the same process condition as one or more of the first section 250a or the second section 250b.

The substrate surface is laterally moved through a gas curtain 150 to a fourth section 250d of the processing chamber. The substrate surface can then be exposed to a fourth process condition in the fourth section 250d. In some embodiments, the fourth section 250d contains the same process condition as one or more of the first section 250a, the second section 250b or the third section 250c.

The fifth section 250e, sixth section 250f, seventh section 250g and/or eighth section 250h can each independently have one or more of the first through fourth process conditions or can have different process conditions. In some embodiments, the first, third, fifth and seventh sections have the same process conditions and the second, fourth, sixth and eighth sections have the same process conditions so that a wafer making one cycle around the processing chamber would be exposed to four repeating exposures of the first process condition and the second process condition. For example, the wafer might be encounter four repeated exposures to an A process and a B process in the first process condition and the second process condition, respectively, to make four AB repetitions.

In some embodiments, the first and fifth sections have a first process condition, the second and sixth sections have a second process condition, the third and seventh sections have a third process condition and the fourth and eighth sections have a fourth process condition. A wafer making a complete cycle around the processing chamber of this configuration would have two repeated exposures to the four sequential process conditions. For example, the wafer might encounter two repeated exposures to an A process, a B process, a C process and a D process in the first process condition, second process condition, third process condition and fourth process condition, respectively, to make two ABCD repetitions.

In some embodiments, at least one of the processing regions is a plasma processing region in which a plasma is generated and at least one of the processing regions is a non-plasma processing region in which there is no plasma generated. The plasma processing region can be a direct plasma processing region in which the susceptor assembly or the substrate acts as an electrode or a remote plasma processing region in which the plasma is generated without the susceptor assembly or the substrate acting as an electrode. The skilled artisan will recognize that a plasma processing region, either direct or remote, will have a suitable power source connected to an RF hot electrode. The power source supplies power of a predetermined frequency to the RF hot electrode. The powered electrode ionizes a gas within the plasma source to form the plasma.

Some embodiments of the disclosure are directed to processing methods comprising moving a substrate between a first processing region without a plasma and a second processing region with a plasma. The first processing region is also referred to as a non-plasma processing region. The second processing region is also referred to as a plasma processing region. The substrate has a breakdown voltage. The skilled artisan will recognize that the substrate refers to any part of the substrate or device (e.g., transistor) being formed on the substrate.

The substrate of some embodiments is larger than the processing region so that not all of the substrate can fit within the processing region at any given time. During movement of the substrate between the plasma processing region and the non-plasma processing region parts of the substrate are exposed to the plasma and parts of the substrate are not exposed to plasma. This non-uniform plasma exposure results in charge buildup or a voltage (potential) differential on the substrate.

In some embodiments, rotation of the substrate around the central axis of the susceptor assembly is sufficient so that any given point on the substrate is within a particular processing region (e.g., the second processing region or plasma processing region) for a time in the range of about 100 milliseconds to about 500 milliseconds. In some embodiments, the rotation speed is sufficient so that any given point on the substrate is exposed to the particular processing region for a time in the range of about 150 milliseconds to about 300 milliseconds, or about 200 milliseconds.

Figure 6:
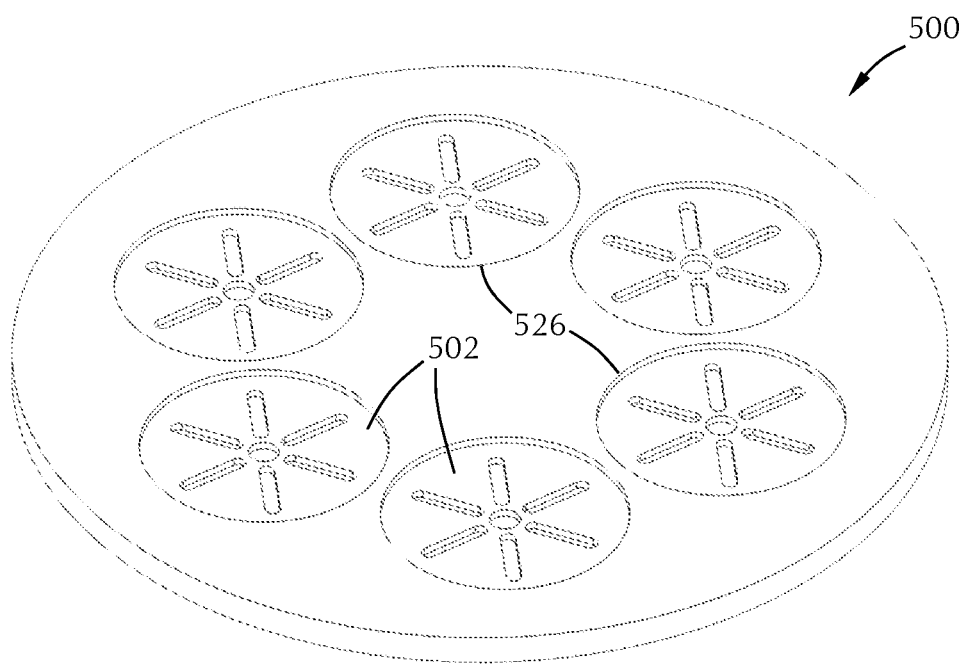
FIG. 6 shows a partial perspective view of a susceptor assembly in accordance with one or more embodiment of the disclosure.
Figure 7:
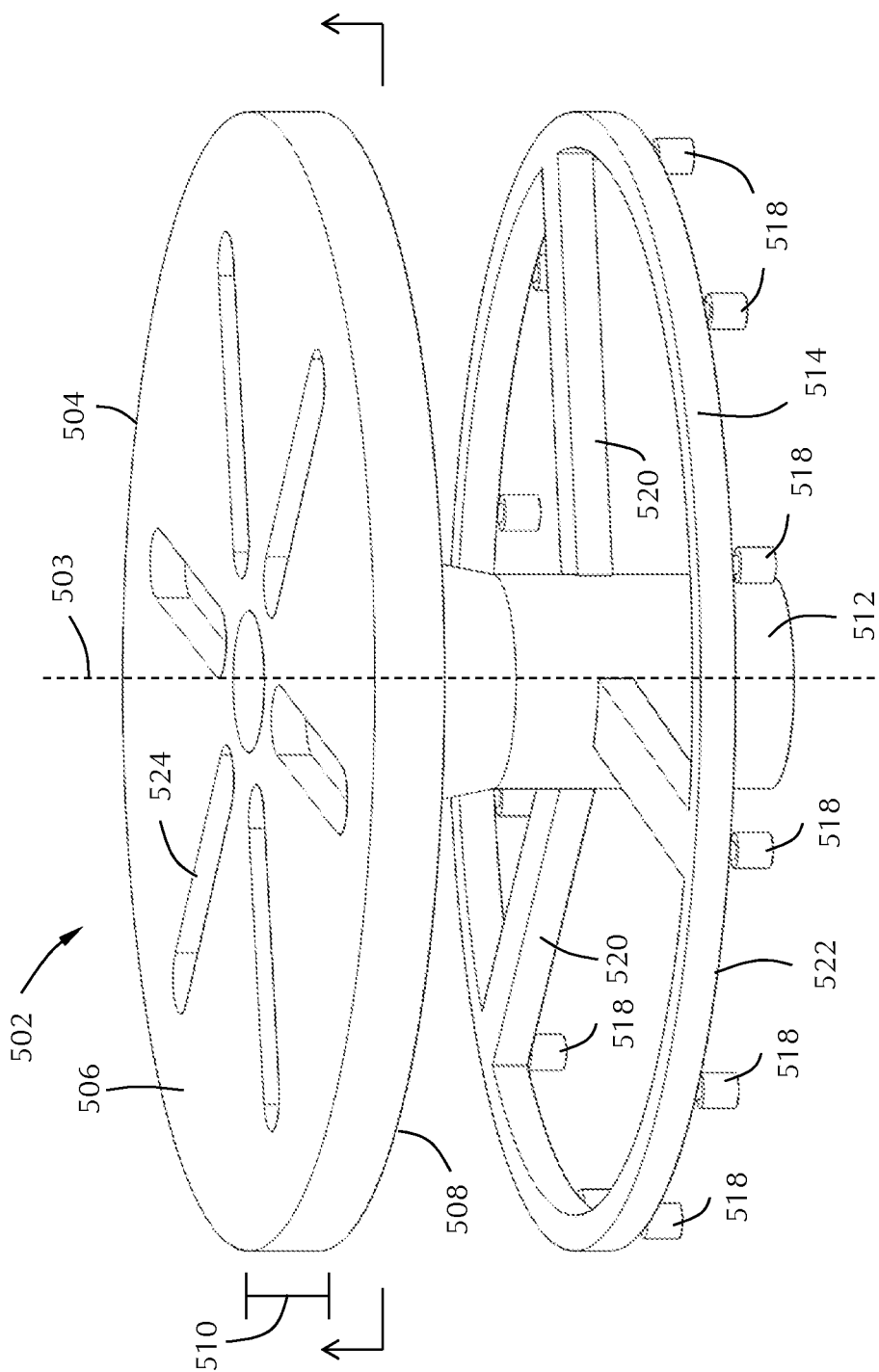
FIG. 7 shows a partial perspective view of a wafer pedestal in accordance with one or more embodiment of the disclosure.
Figure 8:
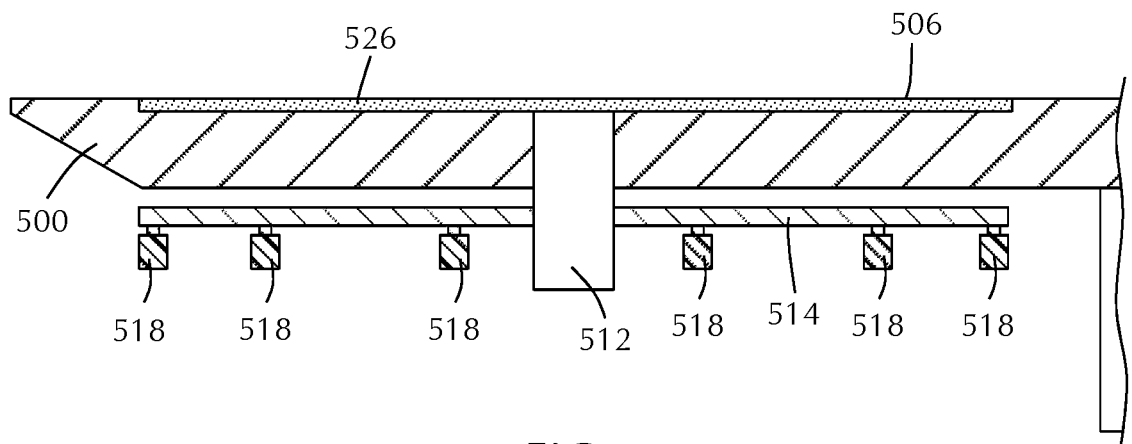
FIG. 8 shows a cross-sectional view of a susceptor assembly in accordance with one or more embodiment of the disclosure.

As shown in FIGS. 6-8, one or more embodiments are directed to a susceptor assembly 500 having a plurality of wafer pedestals 502. The wafer pedestal 502 has a wafer support 504 having a support surface 506 and a bottom surface 508 defining a wafer support thickness 510. In one or more embodiments, the wafer support thickness 510 is in a range of about 1 mm to about 15 mm. The plurality of wafer pedestals 502 are seated in pockets 526 of the susceptor assembly 500. In one or more embodiment, when the wafer pedestal 502 is in a process position, the support surface 504 is a distance below the top surface of the susceptor assembly 500 so that a wafer (not illustrated) on the support surface 504 is substantially coplanar with the support surface 504 of the susceptor assembly 500. As used herein, the term "substantially coplanar" means that the top surface of the wafer and the support surface 504 of the susceptor assembly 500 are coplanar within ±0.2 mm. In some embodiments, the top surface of the wafer and the support surface 504 are coplanar within ±0.15 mm, ±0.10 mm or ±0.05 mm.

Referring to FIGS. 7 and 8, a wafer support shaft 512 is connected to the wafer support 504 and extends from the bottom surface 508. A roller pinion wheel 514 is below the wafer support 504 and in contact with the wafer support shaft 512. The roller pinion wheel 514 of some embodiments is a ring or toroidal shaped component with flat or curved upper and/or lower surfaces. In an embodiment, as illustrated in the Figures, is a ring shaped component with flat upper and lower surfaces which may also be referred to as a flat, circular disk.

The roller pinion wheel 514 has a plurality of roller pinions 518 spaced around the roller pinion wheel 514 at different angular positions, relative to the support shaft 512 or a rotational axis 503 of the wafer support 504. The roller pinions 518 may be spaced around the roller pinion wheel 514 at any suitable distance or angle. In some embodiments, the roller pinions 518 are spaced around the roller pinion wheel 514 at angular positions separated by an angle in the range of about 5° to about 90°, or in the range of about 10° to about 75°, or in the range of about 15° to about 60°, or in the range of about 20° to about 45°, or in the range of about 22.5° to about 30°. The roller pinions 518 may be spaced around the outer wheel 522. In some embodiments, the roller pinions 518 are uniformly spaced around the roller pinion wheel 514. In other embodiments, the roller pinions 518 are irregularly spaced around the roller pinion wheel 514. In one or more embodiment, there are about 6 to about 36 roller pinions 518, or about 8 to about 24 roller pinions 518, or about 10 to about 20 roller pinions 518, or about 12 to about 18 roller pinions 518.

Referring to FIG. 7, in some embodiments, the wafer pedestal 502 has a plurality of openings 524 extending through the wafer support thickness 510. In one or more embodiments, at least some of the plurality of openings 524 are radially aligned slots. In an embodiment, the radially aligned slots are uniformly spaced at different angular positions.

FIG. 8 shows a partial cross-sectional view of a susceptor assembly 500 take along line 8-8' in FIG. 7. The cross-section shown is for one-half of the susceptor assembly 500 from the outer peripheral end to the support post 160. The wafer pedestal 502 is sitting within a pocket or recess in the susceptor assembly 500 with the support shaft 512 extending through an opening (not numbered) in the susceptor bottom of the pocket. The roller pinion wheel 514 is below the main body of the susceptor assembly 500.

Figure 9:
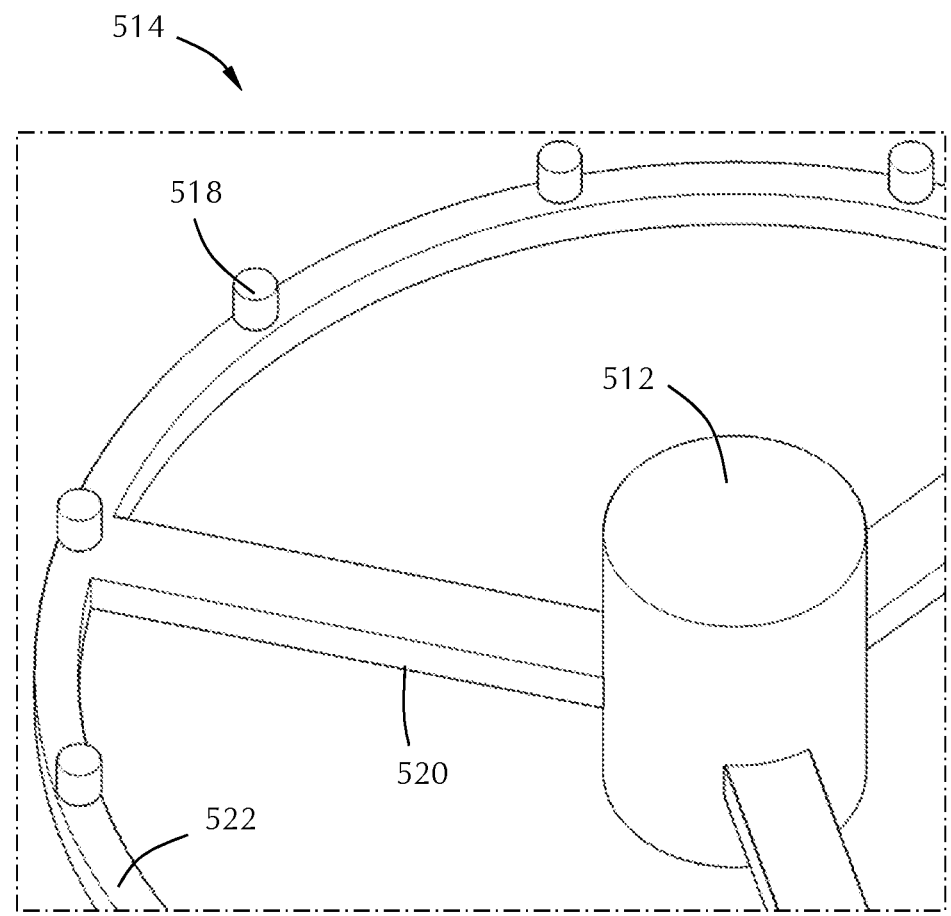
FIG. 9 shows an exploded top view of a roller pinion wheel in accordance with one or more embodiment of the disclosure.

Referring to FIG. 9, a bottom view of a roller pinion wheel 514 according to one or more embodiment is illustrated. The roller pinion wheel 514 is illustrated as a spoked wheel having an outer wheel 522 with a plurality of spokes 520 extending from the wafer support shaft 512 to an outer wheel 522. There can be any suitable number of spokes 520 connecting the wafer support shaft 512 to the outer wheel 522 including, but not limited to, one, two, three, four, five, six, seven, eight, nine, ten or more spokes 520. The spokes 520 can be connected to the wafer support shaft 512 by any suitable connection known to the skilled artisan including, but not limited to, a weld connection and a friction fit connection. The illustrated embodiment shows the spokes 520 in direct contact with the wafer support shaft 512. In some embodiments, the spokes 520 connect the outer wheel 522 to an inner wheel (not shown) in contact with the wafer support shaft 512

Figure 10:
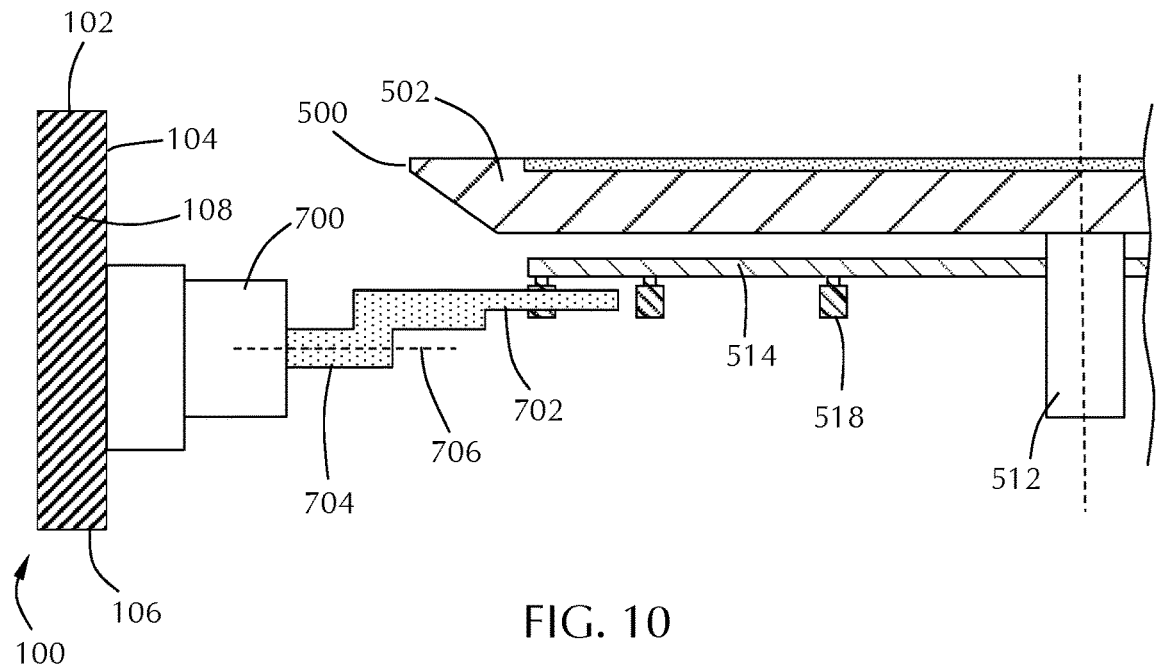
FIG. 10 shows a cross-sectional view of wafer pedestal engaged with an actuator pin in accordance with one or more embodiments of the disclosure.
Figure 11:
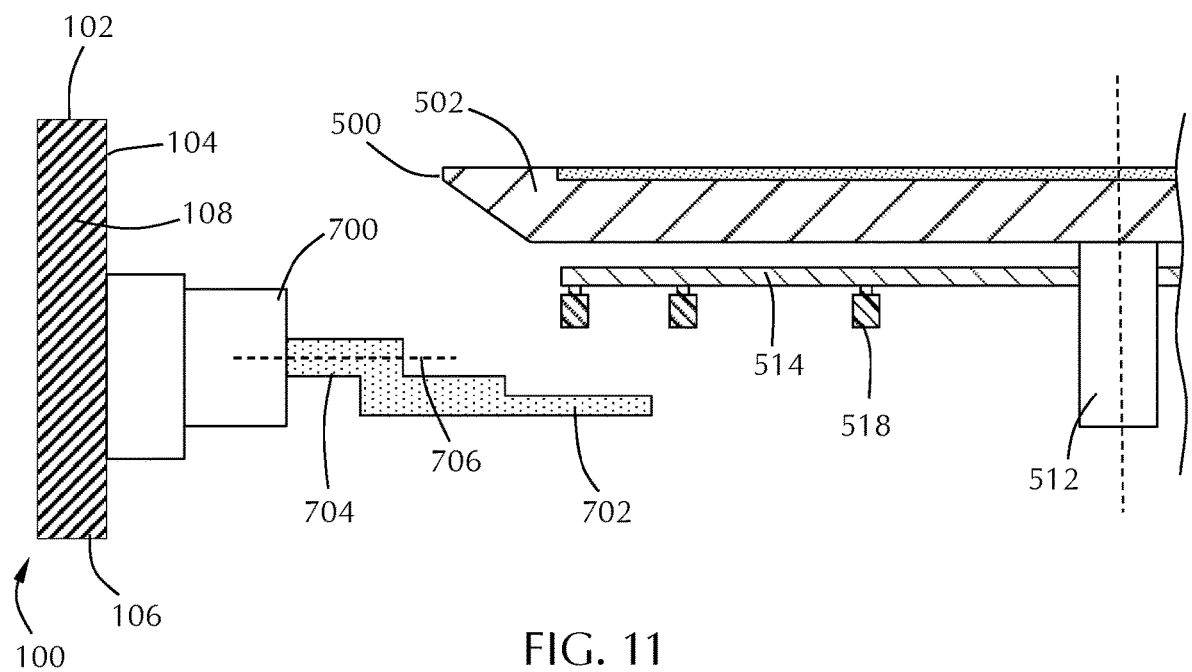
FIG. 11 shows a cross-sectional view of a wafer pedestal engaged with an actuator pin in accordance with one or more embodiments of the disclosure.

Referring to FIGS. 10 and 11, in one or more embodiments, a discrete wafer rotation can be effected without stopping rotation of the susceptor assembly 500, and potentially, during deposition. Some embodiments advantageously provide systems with a roller pinion wheel 514 attached to a wafer pedestal 502 that interacts with an actuator pin 702 while the susceptor rotates. When the actuator pin 702 is in the way of the pinions rollers 518, the wafer pedestal 502 rotates relative to the susceptor 500. The actuator pin 702 could be removed from contact with the roller pinion 518 to stop relative wafer rotation. A wafer rotation angle is controlled by an actuator pin 702 engaged with the pinion roller 518. In one or more embodiments, moving the rotation pin 702 from the non-contact (FIG. 11) to the contact (FIG. 10) position comprises engaging a motor to rotate an actuator shaft 704 around a rotational axis 706 to move a rotation pin 702 connected to the actuator shaft 704 so that the rotation pin 702 precesses around the rotational axis 706.

Figure 12A:
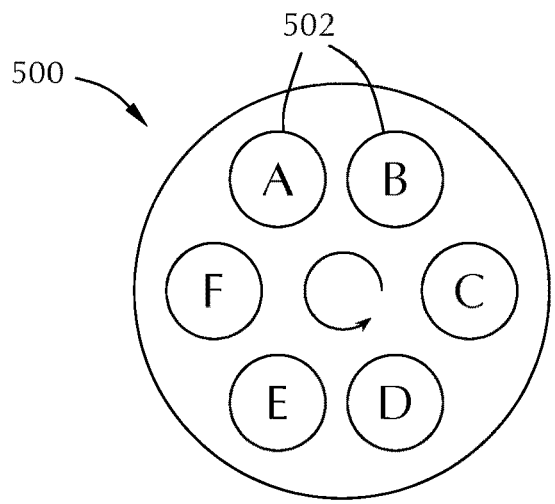
FIGS. 12A through 12C shows a top view exemplifying the rotation of a susceptor assembly in accordance with one or more embodiments of the disclosure.
Figure 12B:
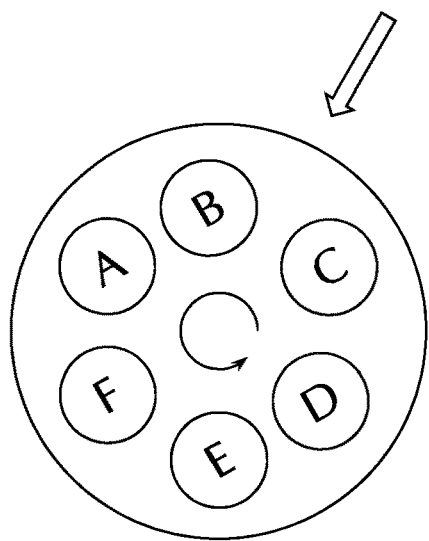
Figure 12C:
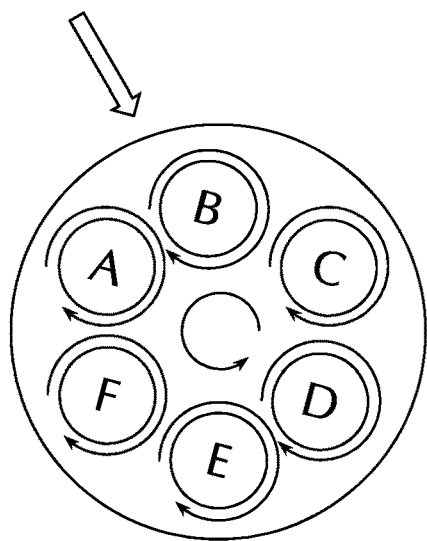

Referring to FIGS. 12A through 12F, the movement of the susceptor assembly 500 and the wafer pedestals are described. In FIG. 12A, the susceptor assembly 500 is in an initial position and rotates counterclockwise. If the wafers are within a fixed position in the susceptor assembly 500, the orientation of the wafers will look like FIG. 12B after/during rotation. If the wafer pedestals 502 of the present disclosure are used, the wafers can be rotated clockwise within the pockets of the susceptor assembly to look like FIG. 12C. This illustrates the movement of a susceptor assembly and wafer pedestals 502 in accordance with one or more embodiments of the disclosure. The embodiment illustrated in FIG. 12C shows all of the wafers A through F being rotated the same amount. However, in some embodiments, only one, two, three, four or five of the wafers are rotated at any given time. In some embodiments, less than half of the wafers are rotated at any given time. In one or more embodiments, one wafer pedestal is rotated at a time. For example, if a single actuator pin 702 is located in the processing chamber, the actuator pin 702 can only contact a single wafer pedestal at a time.

Figure 12D:
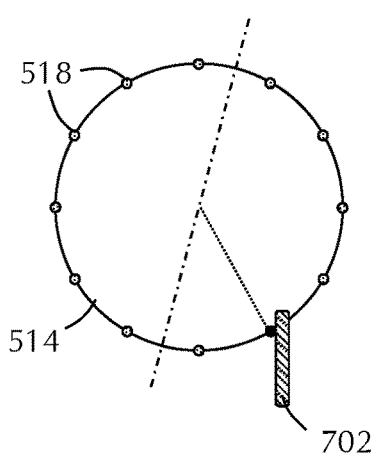
FIGS. 12D through 12F show views of the roller pinion wheel and actuator pin interaction in accordance with one or more embodiment of the disclosure.
Figure 12E:
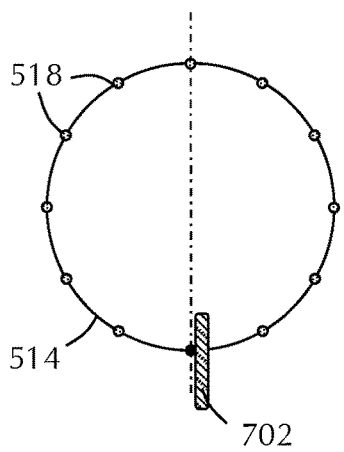
Figure 12F:
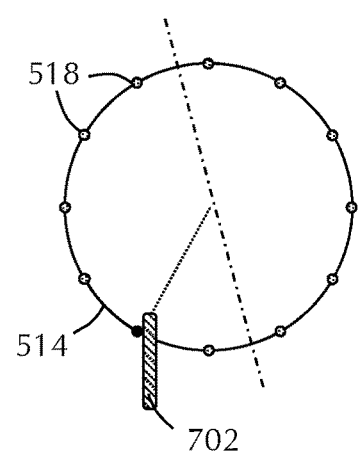

FIGS. 12D through 12F illustrate the movement of the roller pinion wheel 514 due to interaction with the actuator pin 702. The wafer support 504 will be rotated with the roller pinion wheel 514, but is not illustrated for clarity. In FIG. 12D, the actuator pin 702 comes into contact with one of the roller pinions 518. For descriptive purposes, the roller pinion 518 contacted by the actuator pin 702 is darkened. This same pin in shown in FIGS. 12E and 12F in contact with the actuator pin 702 at different angular positions. The dotted line indicates the orientation of the roller pinion wheel 514 during movement. FIG. 12E shows the orientation of the roller pinion wheel 514 when the roller pinion 518 in contact with the actuator pin 702 is at a mid-point of the rotation. FIG. 12F shows the orientation of the roller pinion wheel 514 when shortly before the actuator pin 702 will disengage with the roller pinion 518 and stop rotation of the roller pinion wheel 514.

Figure 13:
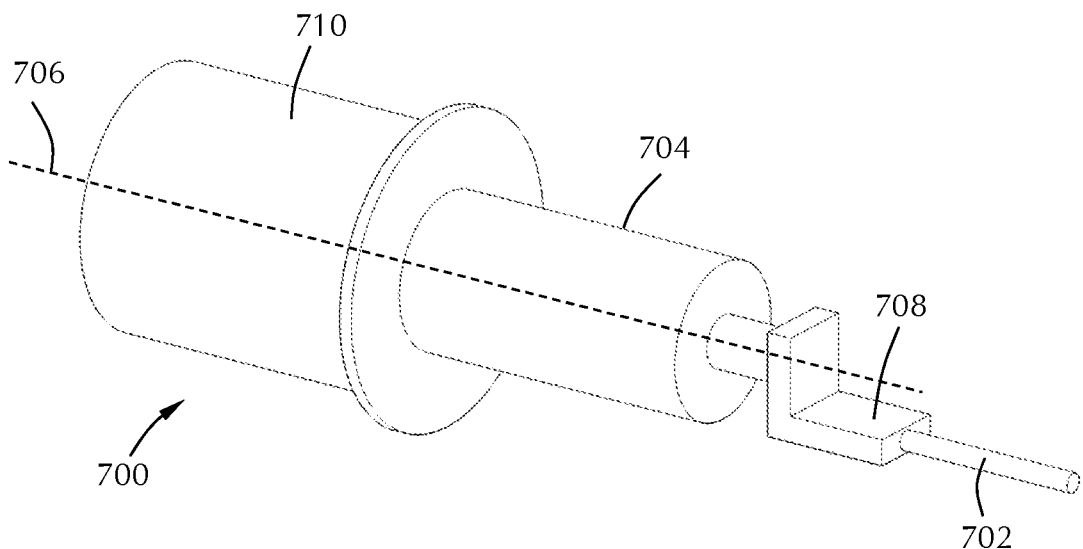
FIG. 13 shows a top view of an actuator in accordance with one or more embodiment of the disclosure.

Referring to FIG. 13, in one or more embodiment, a wafer rotation actuator 700 includes an elongated actuator shaft 704 having an actuator arm 708 and an actuator pin 702, which precesses about a rotational axis 706 to engage one or more pinion roller 518. The wafter rotation actuator 700 is configured to move the rotation actuator pin 702 between a contact and a non-contact position. In an embodiment, the wafer rotation actuator 702 has a motor 710 and an actuator shaft 704 with a rotational axis 706, the rotation pin 702 connected to the shaft 704 in a position offset from the rotational axis 706 so that rotation of the shaft 704 along the rotational axis 706 causes the rotation pin 702 to precess around the rotational axis 706 between a contact and a non-contact position.

In one or more embodiment, the wafer rotation actuator 700 may comprise a lateral motor 710 to move the shaft 704 along the rotational axis 706. For example, the lateral motor 710 may cause the shaft 704 to retreat into and extend further out of an opening in a housing of the lateral motor 710 so that the rotation pin 702 moves closer to and further from the lateral motor 710 along the rotational axis 706. The skilled artisan will recognize from at least FIGS. 12D through 12F, that changing the distance of the rotation pin 702 from the lateral motor 710 can change the amount of time that the rotation pin 702 contacts the roller pinion 518, and change the degree of rotation of the roller pinion wheel.

In one or more embodiment, the rotation pin 702 is positioned to rotate the wafer pedestal 502 in an opposite direction than rotation of the susceptor assembly 500.

Figure 14:
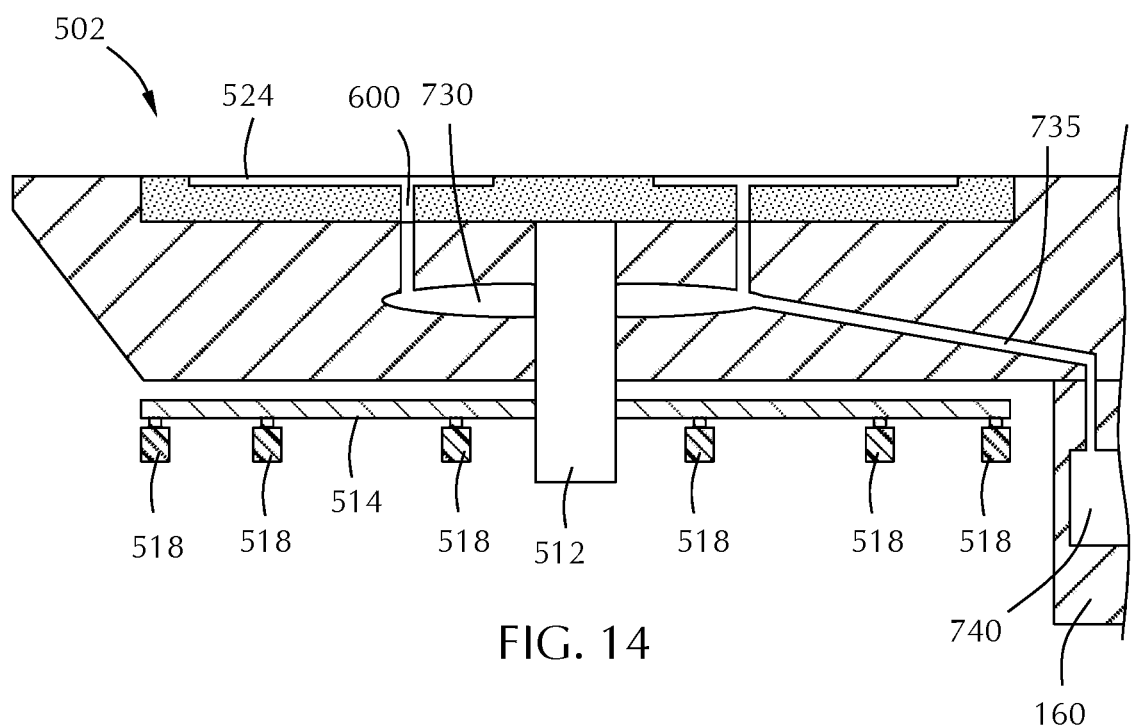
FIG. 14 shows a cross-sectional view of a wafer pedestal in accordance with one or more embodiment of the disclosure.

FIG. 14 shows a cross-section of a wafer pedestal 502 according to one or more embodiments of disclosure. Vacuum holes 730 can be seen in the body of the wafer support. The vacuum holes 730 can be connected to the radial grooves 524 in the top surface of the wafer pedestal 502. (Radial grooves 524 can also be seen in FIG. 7.) The vacuum holes 730 can be connected to a vacuum source or can be open to the interior of the processing chamber. In the illustrated embodiment, the vacuum holes 730 are connected to and in fluid communication with the radial grooves 524 through channels 600. The vacuum holes 730 are also connected to and in fluid communication with a vacuum plenum 740 in the support post 160 through channel 735.

One or more embodiments of the disclosure is directed to a processing method comprising rotating a susceptor assembly around a central axis with a plurality of wafers thereon, at least one wafer supported on a wafer pedestal positioned within a recess or pocket in the susceptor assembly; and contacting a roller pinion on the roller pinion wheel of the wafer pedestal with a rotation pin to rotate the wafer support within the recess.

In an embodiment, the processing method further comprises moving the rotation pin from a non-contact to a contact position.

Further embodiments of the disclosure are directed to a process kit comprising a wafer pedestal according one or more embodiments; and a wafer rotation actuator having a movable rotation pin. The process kit can be retrofit onto an existing susceptor assembly or can be a new assembly including a susceptor assembly 500, as shown in FIG. 6

As shown in FIG. 1, a controller 195 may be provided and coupled to various components of the processing chamber 100 to control the operation thereof. The controller 195 can be a single controller that controls the entire processing chamber 100, or multiple controllers that control individual portions of the processing chamber 100. In some embodiments, the controller 195 includes a central processing unit (CPU) 196, support circuits 197, memory 198, and an input/output (I/O) 199. The controller 195 may control the processing chamber 100 directly, or via computers (or controllers) associated with particular process chamber and/or support system components. The controller 195 may be one of any form of general-purpose computer processor that can be used in an industrial setting for controlling various chambers and sub-processors. The memory 198 includes one or more of transitory memory (e.g., random access memory (RAM)) and/or non-transitory memory (e.g., storage, read only memory (ROM), floppy disk, hard disk, optical storage media (e.g., compact disc or digital video disc), flash drive, or any other form of digital storage, local or remote)). The support circuits 197 are coupled to the CPU 196 for supporting the processor in a conventional manner. These circuits include cache, power supplies, clock circuits, input/output circuitry and subsystems, and the like. One or more processes may be stored in the memory 198 as software routine that may be executed or invoked to control the operation of the processing chamber 100 or individual processing chambers in the manner described herein. The software routine may also be stored and/or executed by a second CPU (not shown) that is remotely located from the hardware being controlled by the CPU 196. The input/output 199 can include keyboards, computer mice, displays and/or printers.

In some embodiments, a controller is coupled to the susceptor assembly and the gas distribution assembly. The controller has one or more configurations to control the various functions and processes. In some embodiments, the configurations are selected from a first configuration to rotate the susceptor assembly about the central axis, a second configuration to provide a flow of gas into the non-plasma processing region, a third configuration to provide a flow of gas into the plasma processing region, a fourth configuration to provide power to the plasma processing region to ignite a plasma and/or a fifth configuration to pulse the power to the plasma processing region to generate an ON time and an OFF time for the plasma processing region.

The methods described herein can be executed by a non-transitory computer-readable storage medium including instructions, that, when executed by a processing unit of a processing system, cause the processing system to perform the disclosed methods. In some embodiments, the non-transitory computer-readable storage medium includes instructions, that, when executed by a processing unit (e.g., controller) of the processing system, cause the processing system to perform one or more operations of: rotating the substrate on the wafer pedestal by aligning an actuator pin with a roller pinion on a roller pinion wheel; rotating an actuator pin around a rotation axis to move the actuator pin to a position in which the actuator pin contacts or does not contact a roller pinion on a roller pinion wheel; or moving an actuator pin along a rotational axis to move the actuator pin to a position that changes the amount of time that the actuator pin contacts the roller pinion wheel during rotation of a wafer.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases.

Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing chamber comprising:
   a chamber body having a top, a bottom and sidewall defining a processing volume;
   a susceptor assembly within the chamber body, the susceptor assembly having a top surface with a plurality of recesses, each recess having a hole extending through the susceptor assembly to the bottom surface, a plurality of wafer pedestals, each wafer pedestal comprising:
      a wafer support having a support surface and a bottom surface defining a wafer support thickness;
      a wafer support shaft connected to and extending from the bottom surface of the wafer support and defining a wafer pedestal rotational axis; and
      a roller pinion wheel below the wafer support in contact with the wafer support shaft, the roller pinion wheel having a plurality of roller pinions spaced around the roller pinion wheel at different angular positions, the roller pinions extending from a bottom surface of the roller pinion wheel,
      wherein interaction of the roller pinion wheel with a rotation pin actuates the wafer support shaft to rotate the wafer support around the wafer pedestal rotational axis,
   wherein each wafer pedestal is positioned in a recess so that each of the wafer support shafts extend below the bottom surface of the susceptor assembly through each of the holes in the plurality of recesses, the susceptor assembly configured to rotate around a central axis;
   at least one rotation pin within the chamber body positioned to contact a roller pinion extending from a bottom surface of the roller pinion wheel of at least one of the wafer pedestals to rotate the at least one wafer pedestal within the recess around the wafer pedestal rotational axis; and
   at least one wafer rotation actuator configured to move the at least one rotation pin between a contact position in which the at least one rotation pin can contact a roller pinion and a non-contact position in which the at least one rotation pin cannot contact a roller pinion, the at least one wafer rotation actuator having a motor and shaft with an actuator rotational axis, the at least one rotation pin connected to the shaft in a position offset from the actuator rotational axis so that rotation of the shaft along the actuator rotational axis causes the at least one rotation pin to precess around the actuator rotational axis between the contact position and the non-contact position.

2. The wafer pedestal of claim 1, wherein the roller pinion wheel comprises a plurality of spokes extending from the wafer support shaft to an outer wheel and the roller pinions are spaced around the outer wheel.

3. The wafer pedestal of claim 1, wherein there are in the range of about 6 to about 36 roller pinions.

4. The wafer pedestal of claim 1, wherein the roller pinions are uniformly spaced around the roller pinion wheel.

5. The wafer pedestal of claim 1, further comprising a plurality of openings extending through the wafer support thickness.

6. The wafer pedestal of claim 5, wherein at least some of the plurality of openings are radially aligned slots.

7. The wafer pedestal of claim 6, wherein the radially aligned slots are uniformly spaced at different angular positions.

8. The wafer pedestal of claim 1, wherein the wafer support thickness is in the range of about 1 mm to about 15 mm.

9. The processing chamber of claim 1, wherein the at least one wafer rotation actuator further comprises a lateral motor to move the shaft along the actuator rotational axis.

10. The processing chamber of claim 1, wherein when the at least one wafer pedestal is in a process position, the support surface is a distance below the top surface of the susceptor assembly so that a wafer on the support surface is substantially coplanar with the top surface of the susceptor assembly.

11. The processing chamber of claim 1, wherein the at least one rotation pin is positioned to rotate the wafer pedestal in an opposite direction than rotation of the susceptor assembly.

12. The processing chamber of claim 1, wherein the wafer support comprises a plurality of radially aligned slots uniformly spaced at different angular positions.

13. The processing chamber of claim 12, wherein the susceptor assembly comprises a circular groove in the at least one of the plurality of recesses, the circular groove in fluid communication with one or more of a vacuum source or an inert gas source.

* * * * *